United States Patent
Chang et al.

(10) Patent No.: US 10,403,365 B2
(45) Date of Patent: Sep. 3, 2019

(54) SWITCH MODULE, MEMORY STORAGE DEVICE AND MULTIPLEXER

(71) Applicant: PHISON ELECTRONICS CORP., Miaoli (TW)

(72) Inventors: Wei-Shin Chang, Hsinchu County (TW); Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 300 days.

(21) Appl. No.: 15/452,742

(22) Filed: Mar. 8, 2017

(65) Prior Publication Data

US 2018/0205224 A1 Jul. 19, 2018

(30) Foreign Application Priority Data

Jan. 13, 2017 (TW) .............................. 106101109 A

(51) Int. Cl.
*H02H 9/04* (2006.01)
*G11C 16/10* (2006.01)
*H01L 27/02* (2006.01)
*G11C 7/10* (2006.01)
*G11C 29/04* (2006.01)

(52) U.S. Cl.
CPC ............. *G11C 16/10* (2013.01); *G11C 7/10* (2013.01); *H01L 27/0288* (2013.01); *G11C 2029/0411* (2013.01); *G11C 2207/105* (2013.01); *H02H 9/046* (2013.01)

(58) Field of Classification Search
CPC .......... H02H 9/04; H02H 9/041; H02H 9/046
USPC ........................................................ 361/56
See application file for complete search history.

(56) References Cited

U.S. PATENT DOCUMENTS

| 9,391,451 B1 | 7/2016 | Ransijn |
| 2007/0115610 A1* | 5/2007 | Oswal .............. G11C 27/024 |
| | | 361/434 |
| 2011/0058294 A1* | 3/2011 | Wu ................ H01L 27/0248 |
| | | 361/57 |

OTHER PUBLICATIONS

"Office Action of Taiwan Counterpart Application," dated Jan. 19, 2018, p. 1-p. 5.

* cited by examiner

*Primary Examiner* — Dharti H Patel
(74) *Attorney, Agent, or Firm* — JCIPRNET

(57) ABSTRACT

An exemplary embodiment of the disclosure provides a switch module which includes a first conductive unit, a first switch unit and a first electrostatic protection module. The first electrostatic protection module is coupled between the first conductive unit and the first switch unit. The first electrostatic protection module includes a first protection circuit and a first inductor circuit. The first inductor circuit includes a first inductor unit, and the first inductor circuit is coupled between the first protection circuit and the first conductive unit. Accordingly, the transmission efficiency of the switch (or multiplexer) for high speed signal can be improved.

20 Claims, 11 Drawing Sheets

SWITCH MODULE, MEMORY STORAGE DEVICE AND MULTIPLEXER

CROSS-REFERENCE TO RELATED APPLICATION

This application claims the priority benefit of Taiwan application serial no. 106101109, filed on Jan. 13, 2017. The entirety of the above-mentioned patent application is hereby incorporated by reference herein and made a part of this specification.

BACKGROUND

Technical Field

The disclosure relates to a switch circuit, and more particularly, relates to a switch module, a memory storage device and a multiplexer.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

ESD (Electrostatic Discharge) is the major reason why many electronic systems suffered damages from EOS (Electrical Overstress). Therefore, a switch for high speed signal transmission is generally disposed with an ESD protection circuit to reduce ESD interference during the process of high speed signal transmission. However, the switch itself may also suffer from influence caused by parasitic capacitance of the ESD protection circuit, which reduces transmission bandwidth of the signal passing through the switch.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a switch module, a memory storage device and a multiplexer, which are capable of improving a transmission efficiency of the switch module for high speed signal.

An exemplary embodiment of the disclosure provides a switch module which includes a first conductive unit, a first switch unit and a first electrostatic protection module. The first electrostatic protection module is coupled between the first conductive unit and the first switch unit. The first electrostatic protection module includes a first protection circuit and a first inductor circuit. The first inductor circuit includes a first inductor unit, and the first inductor circuit is coupled between the first protection circuit and the first conductive unit.

Another exemplary embodiment of the disclosure provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The connection interface unit includes a first switch module. The first switch module includes a first conductive unit, a first switch unit and a first electrostatic protection module. The first electrostatic protection module is coupled between the first conductive unit and the first switch unit. The first electrostatic protection module includes a first protection circuit and a first inductor circuit. The first inductor circuit includes a first inductor unit, and the first inductor circuit is coupled between the first protection circuit and the first conductive unit.

An exemplary embodiment of the disclosure provides a multiplexer, which includes a first terminal, a second terminal, a third terminal, a control terminal and a switch module. The switch module is coupled to the first terminal, the second terminal, the third terminal and the control terminal and configured to turn on a conductive path between the first terminal and the second terminal or between the first terminal and the third terminal according to a select signal of the control terminal. The switch module includes a first conductive unit, a first switch unit and a first electrostatic protection module. The first electrostatic protection module is coupled between the first conductive unit and the first switch unit. The first electrostatic protection module includes a first protection circuit and a first inductor circuit. The first inductor circuit includes a first inductor unit, and the first inductor circuit is coupled between the first protection circuit and the first conductive unit.

Based on the above, the switch module of the disclosure includes the conductive unit, the switch unit and the electrostatic protection module. The electrostatic protection module is coupled between the conductive unit and the first switch unit and includes the protection circuit and the inductor circuit. In particular, the inductor circuit includes at least one inductor unit and is coupled between the protection circuit and the conductive unit. Accordingly, the transmission efficiency of the switch for high speed signal can be improved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
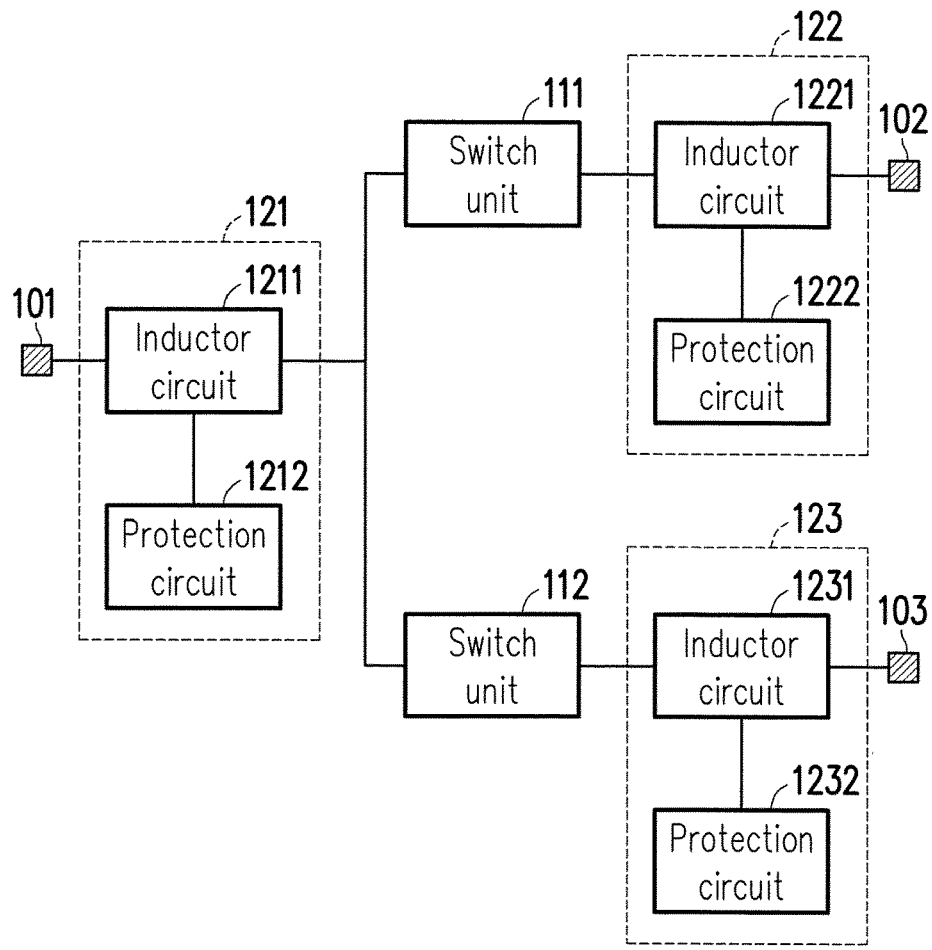
FIG. 1A is a schematic diagram illustrating a switch module according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the disclosure in detail, though the disclosure is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

FIG. 1A is a schematic diagram illustrating a switch module according to an exemplary embodiment of the disclosure.

Referring to FIG. 1A, a switch module 10 includes conductive units 101 to 103, switch units 111 and 112, and electrostatic protection modules 121 to 123. Each of the conductive units 101 to 103 has electrical conductivity and may be made of metal or non-metal. The switch unit 111 is coupled between the conductive unit 101 and the conductive unit 102 and is configured to turn on a conductive path (also known as a signal path) between the conductive unit 101 and the switch unit 111 and a conductive path between the switch unit 111 and the conductive unit 102. The switch unit 112 is coupled between the conductive unit 101 and the conductive unit 103 and is configured to turn on a conductive path between the conductive unit 101 and the switch unit 112 and a conductive path between the switch unit 112 and the conductive unit 103.

During operation of the switch module 10, (only) one of the switch units 111 and 112 is selectively turned on instead of both of them at the same time. If the switch unit 111 is in ON state and the switch unit 112 is in OFF state, signal can be received from the conductive unit 101 and transmitted to the conductive unit 102 through the switch unit 111 or can be received from the conductive unit 102 and transmitted to the conductive unit 101 through the switch unit 111. In addition, if the switch unit 111 is in OFF state and the switch unit 112 is in ON state, signal can be received from the conductive unit 101 and transmitted to the conductive unit 103 through the switch unit 112 or can be received from the conductive unit 103 and transmitted to the conductive unit 101 through the switch unit 112.

Figure 1B:
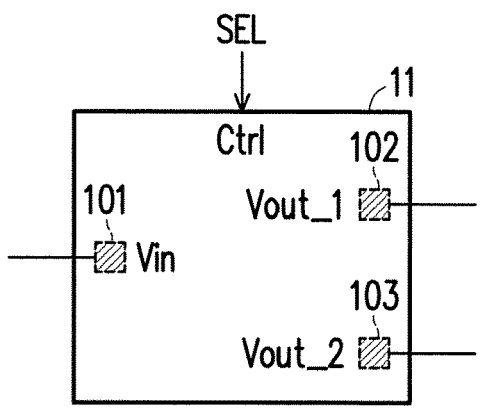
FIG. 1B is a schematic diagram illustrating a switch according to an exemplary embodiment of the disclosure.

FIG. 1B is a schematic diagram illustrating a switch according to an exemplary embodiment of the disclosure.

Referring to FIG. 1B, in an exemplary embodiment, the switch module 10 in FIG. 1A can be disposed in a switch (also known as a multiplexer) 11. For example, the conductive unit 101 can be disposed at a terminal (also known as a first terminal) Vin of the switch 11, the conductive unit 102 can be disposed at a terminal (also known as a second tell sinal) Vout_1 of the switch 11, and the conductive unit 103 can be disposed at a terminal (also known as a third terminal) Vout_2 of the switch 11, as shown in FIG. 1B. The switch 11 can receive a select signal SEL on a control terminal Ctrl and turn on a conductive path between the terminal Vin and the terminal Vout_1 or between the terminal Vin and the terminal Vout_2 according to the select signal SEL.

Referring back to FIG. 1A, the electrostatic protection module 121 is coupled between the conductive unit 101 and the switch unit 111. The electrostatic protection module 122 is coupled between the conductive unit 102 and the switch unit 111. The electrostatic protection module 123 is coupled between the conductive unit 103 and the switch unit 112. The electrostatic protection modules 121 and 122 are configured to provide electrostatic protection for signals on the conductive path between the conductive units 101 and 102. In addition, the electrostatic protection modules 121 and 123 are configured to provide electrostatic protection for signals on the conductive path between the conductive units 101 and 103. It should be noted that, the so-called electrostatic protection refers to an ESD (Electrostatic Discharge) protection for signals received through one certain conductive unit (e.g., at least one of the conductive units 101 to 103), which can prevent a specific electronic component from damages caused by adverse influence such as EOS (Electrical Overstress).

The electrostatic protection module 121 includes a protection circuit 1212, the electrostatic protection module 122 includes a protection circuit 1222, and the electrostatic protection module 123 includes a protection circuit 1232. The protection circuit 1212 is coupled between the conductive unit 101 and the switch unit 111, the protection circuit 1222 is coupled between the conductive unit 102 and the switch unit 111, and the protection circuit 1232 is coupled between the conductive unit 103 and the switch unit 112, as shown in FIG. 1A. For example, each of the protection circuits 1212, 1222 and 1232 can include at least one capacitor component to provide the corresponding electrostatic protection on the respective coupled signal path. In one exemplary embodiment, each of the protection circuits 1212, 1222 and 1232 may also be referred to as an electrostatic discharge (protection) circuit.

In the present exemplary embodiment, the electrostatic protection module 121 further includes an inductor circuit 1211, the electrostatic protection module 122 further includes an inductor circuit 1221, and the electrostatic protection module 123 further includes an inductor circuit 1231. The inductor circuit 1211 is coupled between the protection circuit 1212 and the conductive unit 101, the inductor circuit 1221 is coupled between the protection circuit 1222 and the conductive unit 102, and the inductor circuit 1231 is coupled between the protection circuit 1232 and the conductive unit 103, as shown in FIG. 1A.

Each of the inductor circuits 1211, 1221 and 1231 includes at least one inductor unit. For example, one inductor unit may refer to one single inductor component or may be composed of multiple inductor component. In general, when signals pass through the switch of FIG. 1B, signals may be influenced by the electrostatic discharge protection circuits in the switch, resulting in adverse influence such as signal intensity decay and/or bandwidth reduction. In particular, high speed signal is influenced by the electrostatic discharge protection circuits more significantly. In an exemplary embodiment, the so-called high speed signal refers to signal (or data signal) having a frequency higher than 5 GHz. However, in another exemplary embodiment, the frequency (or a frequency threshold) for identifying high speed signal from non-high speed signal may also be higher (e.g., 10 GHz) or lower (e.g., 4 GHz), which is not particularly limited by the disclosure.

However, in the case of FIG. 1A in which the inductor circuits 1211, 1221 and 1231 are disposed, after high speed signal is received by the switch module 10 from one of the conductive units 101 to 103, the inductor circuit on the conductive path for transmitting high speed signal can at least partially mask the corresponding electrostatic discharge protection circuit. For example, when high speed signal is transmitted between the conductive units 101 and 102, the inductor circuit 1211 masks the protection circuit 1212 and the inductor circuit 1221 masks the protection circuit 1222. Alternatively, when high speed signal is transmitted between the conductive units 101 and 103, the inductor circuit 1211 masks the protection circuit 1212 and the inductor circuit 1231 masks the protection circuit 1232. Accordingly, the normal operations (e.g., filtering static electricity from human body) of the electrostatic discharge protection circuit can be maintained, and the influence on high speed signal caused by the electrostatic discharge protection circuit can also be reduced.

It should be noted that, FIG. 1A and the above description are provided based on that the inductor circuits 1211, 1221 and 1231 are disposed in the switch module 10 at the same time for example. Nonetheless, in another exemplary embodiment, it is also be possible that (only) at least one of the inductor circuits 1211, 1221 and 1231 is disposed in the switch module 10, and the disclosure is not limited thereto.

Also, for descriptive convenience, in the following exemplary embodiments, the electrostatic protection module 121 is represented by an electrostatic protection module disposed at a first position, the electrostatic protection module 122 is represented by an electrostatic protection module disposed at a second position, and the electrostatic protection module 123 is represented by an electrostatic protection module disposed at a third position.

FIG. 2A to FIG. 2D are schematic diagrams illustrating the electrostatic protection module disposed at a first position according to exemplary embodiments of the disclosure. It should be noted that, in the following exemplary embodiments, each of the switch units 111 and 112 is illustrated as one transistor that can be used as a switch for example, but the disclosure is not limited thereto. For example, the transistor may be N-type MOSFET (Metal-Oxide-Semiconductor Field-Effect Transistor) or with other type.

Figure 2A:
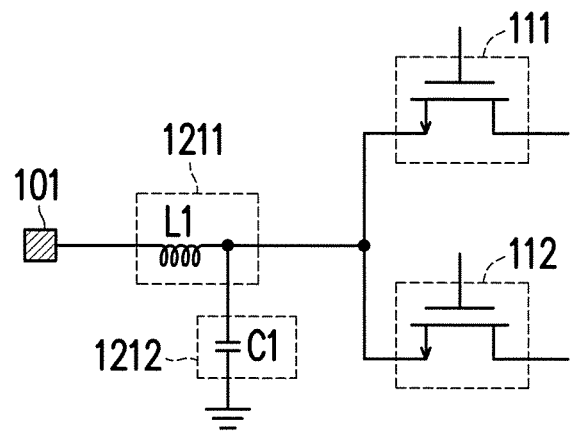
FIG. 2A to FIG. 2D are schematic diagrams illustrating the electrostatic protection module disposed at a first position according to exemplary embodiments of the disclosure.

Referring to FIG. 2A, in the present exemplary embodiment, the inductor circuit 1211 includes an inductor unit L1 and the protection circuit 1212 includes a capacitor unit C1. A first terminal of the inductor unit L1 is coupled to the conductive unit 101. A second terminal of the inductor unit L1 is coupled to a first terminal of the capacitor unit C1. A second terminal of the capacitor unit C1 is grounded. Further, in the present exemplary embodiment, the second terminal of the inductor unit L1 and the first terminal of the capacitor unit C1 are both coupled to a first terminal of the switch unit 111 and a first terminal of the switch unit 112.

Figure 2B:
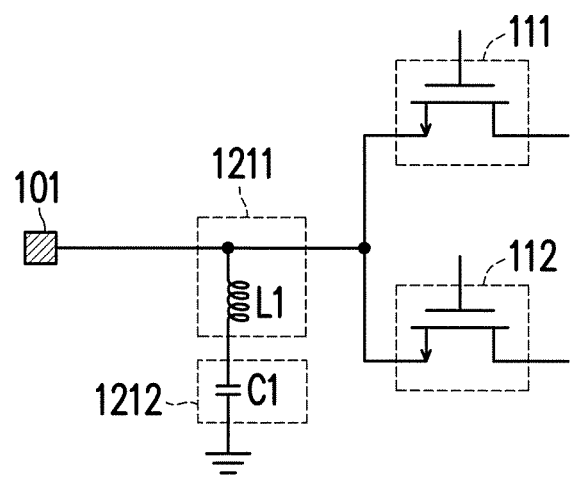

Referring to FIG. 2B, in the present exemplary embodiment, the inductor circuit 1211 includes an inductor unit L1 and the protection circuit 1212 includes a capacitor unit C1. A first terminal of the inductor unit L1 is coupled to the conductive unit 101, a first terminal of the switch unit 111 and a first terminal of the switch unit 112. A second terminal of the inductor unit L1 is coupled to a first terminal of the capacitor unit C1. A second terminal of the capacitor unit C1 is grounded.

Figure 2C:
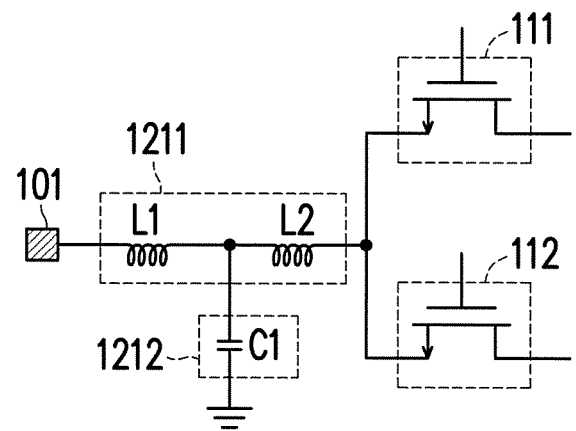

Referring to FIG. 2C, in the present exemplary embodiment, the inductor circuit 1211 includes inductor units L1 and L2 and the protection circuit 1212 includes a capacitor unit C1. The protection circuit 1212 is coupled between the inductor units L1 and L2. More specifically, a first terminal of the inductor unit L1 is coupled to the conductive unit 101. A second terminal of the inductor unit L1 is coupled to a first terminal of the inductor unit L2 and a first terminal of the capacitor unit C1. A second terminal of the inductor unit L2 is coupled to a first terminal of the switch unit 111 and a first terminal of the switch unit 112. A second terminal of the capacitor unit C1 is grounded. It should be noted that, the inductor circuit 1211 with the inductor units L1 and L2 disposed as shown in FIG. 2C is also known as a T-coil circuit.

Figure 2D:
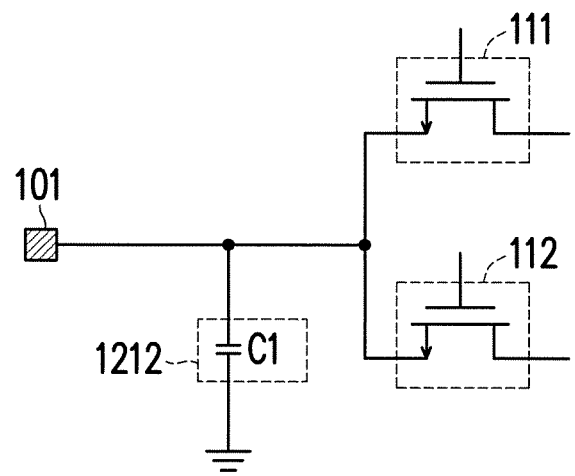

Referring to FIG. 2D, compared to the exemplary embodiments of FIG. 2A to FIG. 2C, the inductor circuit 1211 is not additionally disposed in the electrostatic protection module 121 in the present exemplary embodiment. Accordingly, a first terminal of the capacitor unit C1 is coupled to the conductive unit 101, a first terminal of the switch unit 111 and a first terminal of the switch unit 112. It should be noted that, in an exemplary embodiment of FIG. 1A, when the electrostatic protection module 121 is implemented without the inductor circuit 1211, the electrostatic protection module 122 includes the inductor circuit 1221 and/or the electrostatic protection module 123 includes the inductor circuit 1231.

FIG. 3A to FIG. 3D are schematic diagrams illustrating the electrostatic protection module disposed at a second position according to exemplary embodiments of the disclosure.

Figure 3A:
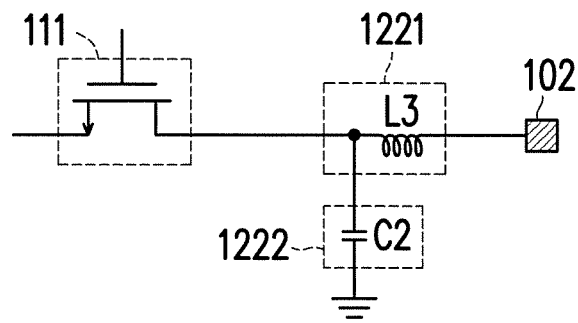
FIG. 3A to FIG. 3D are schematic diagrams illustrating the electrostatic protection module disposed at a second position according to exemplary embodiments of the disclosure.

Referring to FIG. 3A, in the present exemplary embodiment, the inductor circuit 1221 includes an inductor unit L3 and the protection circuit 1222 includes a capacitor unit C2. A first terminal of the inductor unit L3 is coupled to the conductive unit 102. A second terminal of the inductor unit L3 is coupled to a first terminal of the capacitor unit C2. A second terminal of the capacitor unit C2 is grounded. Further, in the present exemplary embodiment, the second terminal of the inductor unit L3 and the first terminal of the capacitor unit C2 are both coupled to a second terminal of the switch unit 111.

Figure 3B:
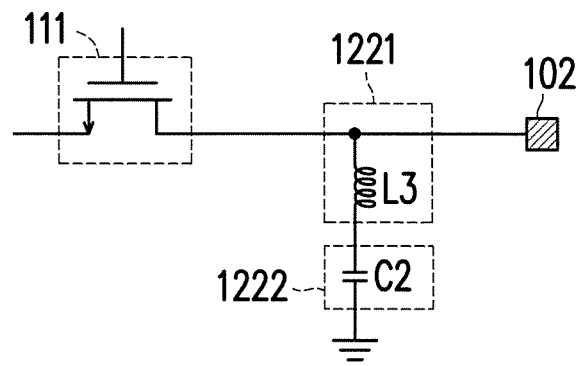

Referring to FIG. 3B, in the present exemplary embodiment, the inductor circuit 1221 includes an inductor unit L3 and the protection circuit 1222 includes a capacitor unit C2. A first terminal of the inductor unit L3 is coupled to the conductive unit 102 and a second terminal of the switch unit 111. A second terminal of the inductor unit L3 is coupled to a first terminal of the capacitor unit C2. A second terminal of the capacitor unit C2 is grounded.

Figure 3C:
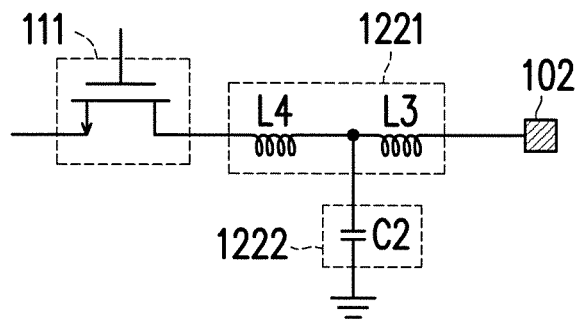

Referring to FIG. 3C, in the present exemplary embodiment, the inductor circuit 1221 includes inductor units L3 and L4 and the protection circuit 1222 includes a capacitor unit C2. The protection circuit 1222 is coupled between the inductor units L3 and L4. More specifically, a first terminal of the inductor unit L3 is coupled to the conductive unit 102. A second terminal of the inductor unit L3 is coupled to a first terminal of the inductor unit L4 and a first terminal of the capacitor unit C2. A second terminal of the inductor unit L4 is coupled to a second terminal of the switch unit 111. A second terminal of the capacitor unit C2 is grounded. It should be noted that, the inductor circuit 1221 with the inductor units L3 and L4 disposed as shown in FIG. 3C is also known as the T-coil circuit.

Figure 3D:
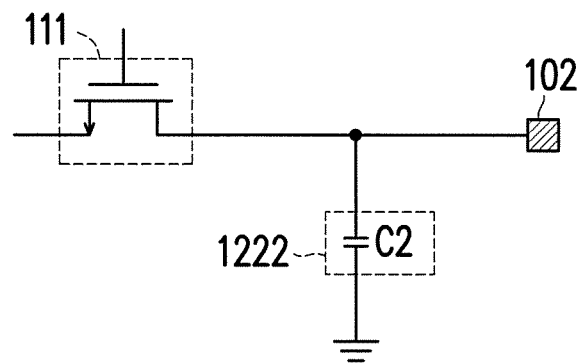

Referring to FIG. 3D, compared to the exemplary embodiments of FIG. 3A to FIG. 3C, the inductor circuit 1221 is not additionally disposed in the electrostatic protection module 122 in the present exemplary embodiment. Accordingly, a first terminal of the capacitor unit C2 is coupled to the conductive unit 102 and a second terminal of the switch unit 111. It should be noted that, in an exemplary embodiment of FIG. 1A, when the electrostatic protection module 122 is implemented without the inductor circuit 1221, the electrostatic protection module 121 includes the inductor circuit 1211 and/or the electrostatic protection module 123 includes the inductor circuit 1231.

FIG. 4A to FIG. 4D are schematic diagrams illustrating the electrostatic protection module disposed at a third position according to exemplary embodiments of the disclosure.

Figure 4A:
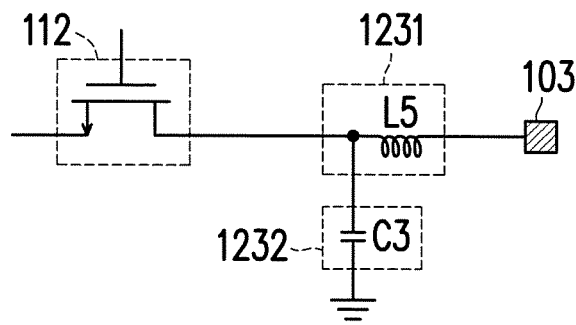
FIG. 4A to FIG. 4D are schematic diagrams illustrating the electrostatic protection module disposed at a third position according to exemplary embodiments of the disclosure.

Referring to FIG. 4A, in the present exemplary embodiment, the inductor circuit 1231 includes an inductor unit L5 and the protection circuit 1232 includes a capacitor unit C3. A first terminal of the inductor unit L5 is coupled to the conductive unit 103. A second terminal of the inductor unit L5 is coupled to a first terminal of the capacitor unit C3. A second terminal of the capacitor unit C3 is grounded. Further, in the present exemplary embodiment, the second terminal of the inductor unit L5 and the first terminal of the capacitor unit C3 are both coupled to a second terminal of the switch unit 112.

Figure 4B:
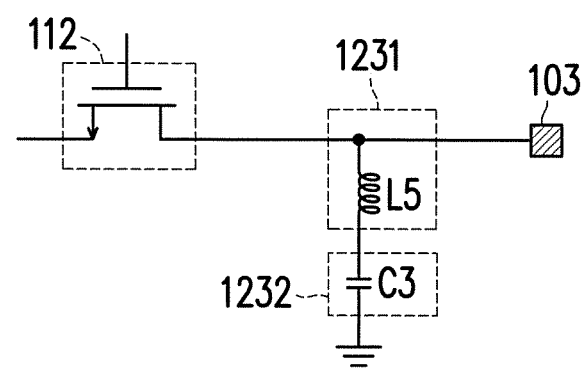

Referring to FIG. 4B, in the present exemplary embodiment, the inductor circuit 1231 includes an inductor unit L5 and the protection circuit 1232 includes a capacitor unit C3. A first terminal of the inductor unit L5 is coupled to the conductive unit 103 and a second terminal of the switch unit 112. A second terminal of the inductor unit L5 is coupled to a first terminal of the capacitor unit C3. A second terminal of the capacitor unit C3 is grounded.

Figure 4C:
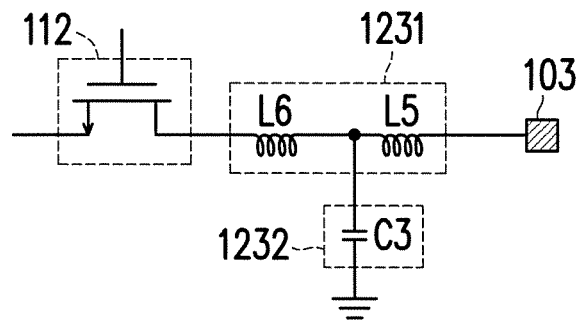

Referring to FIG. 4C, in the present exemplary embodiment, the inductor circuit 1231 includes inductor units L5 and L6 and the protection circuit 1232 includes a capacitor unit C3. The protection circuit 1232 is coupled between the inductor units L5 and L6. More specifically, a first terminal of the inductor unit L5 is coupled to the conductive unit 103. A second terminal of the inductor unit L5 is coupled to a first terminal of the inductor unit L6 and a first terminal of the capacitor unit C3. A second terminal of the inductor unit L6 is coupled to a second terminal of the switch unit 112. A second terminal of the capacitor unit C3 is grounded. It should be noted that, the inductor circuit 1231 with the inductor units L5 and L6 disposed as shown in FIG. 4C is also known as the T-coil circuit.

Figure 4D:
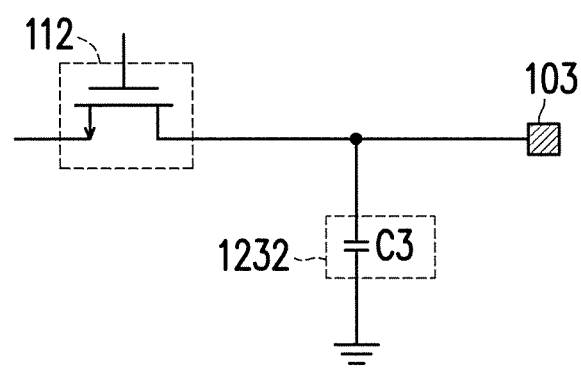

Referring to FIG. 4D, compared to the exemplary embodiments of FIG. 4A to FIG. 4C, the inductor circuit 1231 is not additionally disposed in the electrostatic protection module 123 in the present exemplary embodiment. Accordingly, a first terminal of the capacitor unit C3 is coupled to the conductive unit 103 and a second terminal of the switch unit 112. It should be noted that, in an exemplary embodiment of FIG. 1A, when the electrostatic protection module 123 is implemented without the inductor circuit 1231, the electrostatic protection module 121 includes the inductor circuit 1211 and/or the electrostatic protection module 122 includes the inductor circuit 1221.

In an exemplary embodiment, the switch module 10 of FIG. 1A may be disposed in any electronic device or electronic system to transmit specific signal. However, in another exemplary embodiment, the switch module 10 of FIG. 1A is disposed in a memory storage device. Generally, the memory storage device (also known as a memory storage system) includes a rewritable non-volatile memory module and a controller (also known as a control circuit). The memory storage device is usually configured together with a host system so the host system can write data into the memory storage device or read data from the memory storage device.

Figure 5:
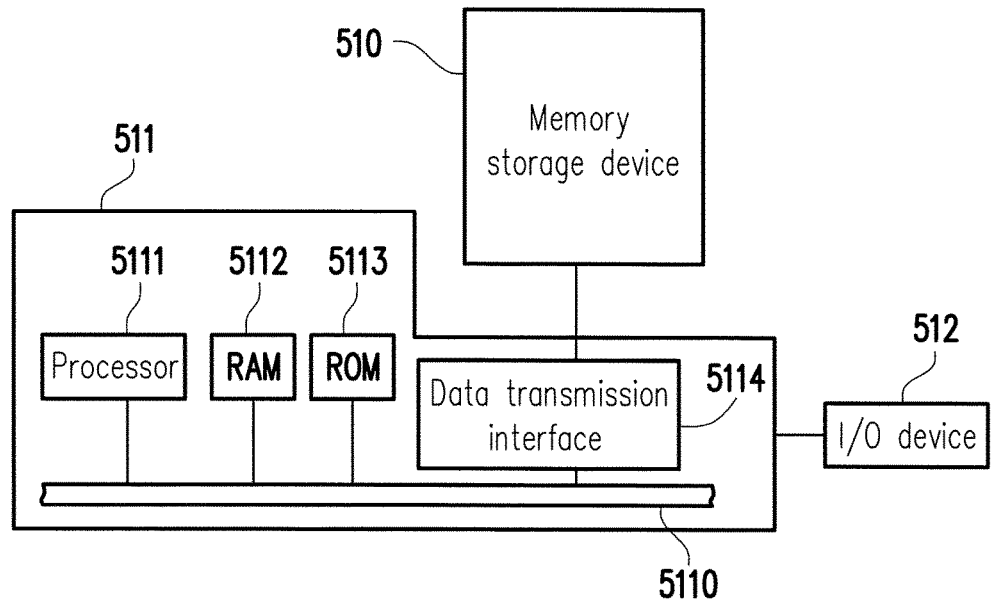
FIG. 5 is a schematic diagram illustrating a host system, a memory storage device and an I/O (input/output) device according to an exemplary embodiment of the disclosure.
Figure 6:
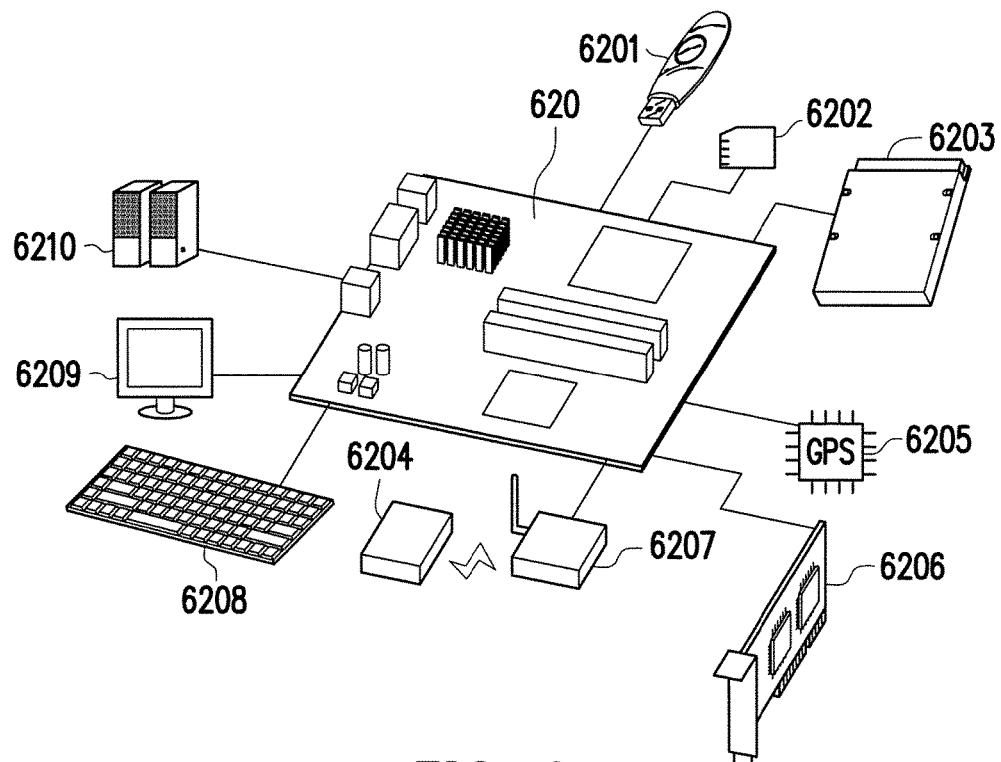
FIG. 6 is a schematic diagram illustrating a host system, a memory storage device and an I/O device according to another exemplary embodiment of the disclosure.

FIG. 5 is a schematic diagram illustrating a host system, a memory storage device and an I/O (input/output) device according to an exemplary embodiment of the disclosure. FIG. 6 is a schematic diagram illustrating a host system, a memory storage device and an I/O device according to another exemplary embodiment of the disclosure.

Referring to FIG. 5 and FIG. 6, a host system 511 generally includes a processor 5111, a RAM (random access memory) 5112, a ROM (read only memory) 5113 and a data transmission interface 5114. The processor 5111, the RAM 5112, the ROM 5113 and the data transmission interface 5114 are coupled to a system bus 5110.

In the present exemplary embodiment, the host system 511 is coupled to a memory storage device 510 through the data transmission interface 5114. For example, the host system 511 can store data into the memory storage device 510 or read data from the memory storage device 510 through the data transmission interface 5114. Further, the host system 511 is coupled to an I/O device 512 via the system bus 5110. For example, the host system 511 can transmit output signals to the I/O device 512 or receive input signals from the I/O device 512 via the system bus 5110.

In the present exemplary embodiment, the processor 5111, the RAM 5112, the ROM 5113 and the data transmission interface 5114 may be disposed on a main board 620 of the host system 511. The number of the data transmission interface 5114 may be one or more. Through the data transmission interface 5114, the main board 620 may be coupled to the memory storage device 510 in a wired manner or a wireless manner. The memory storage device 510 may be, for example, a flash drive 6201, a memory card 6202, a SSD (Solid State Drive) 6203 or a wireless memory storage device 6204. The wireless memory storage device 6204 may be, for example, a memory storage device based on one or more wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 620 may also be coupled to various I/O devices such as a GPS (Global Positioning System) module 6205, a network interface card 6206, a wireless transmission device 6207, a keyboard 6208, a monitor 6209 and a speaker 6210 through the system bus 5110. For example, in an exemplary embodiment, the main board 620 can access the wireless memory storage device 6204 via the wireless transmission device 6207.

Figure 7:
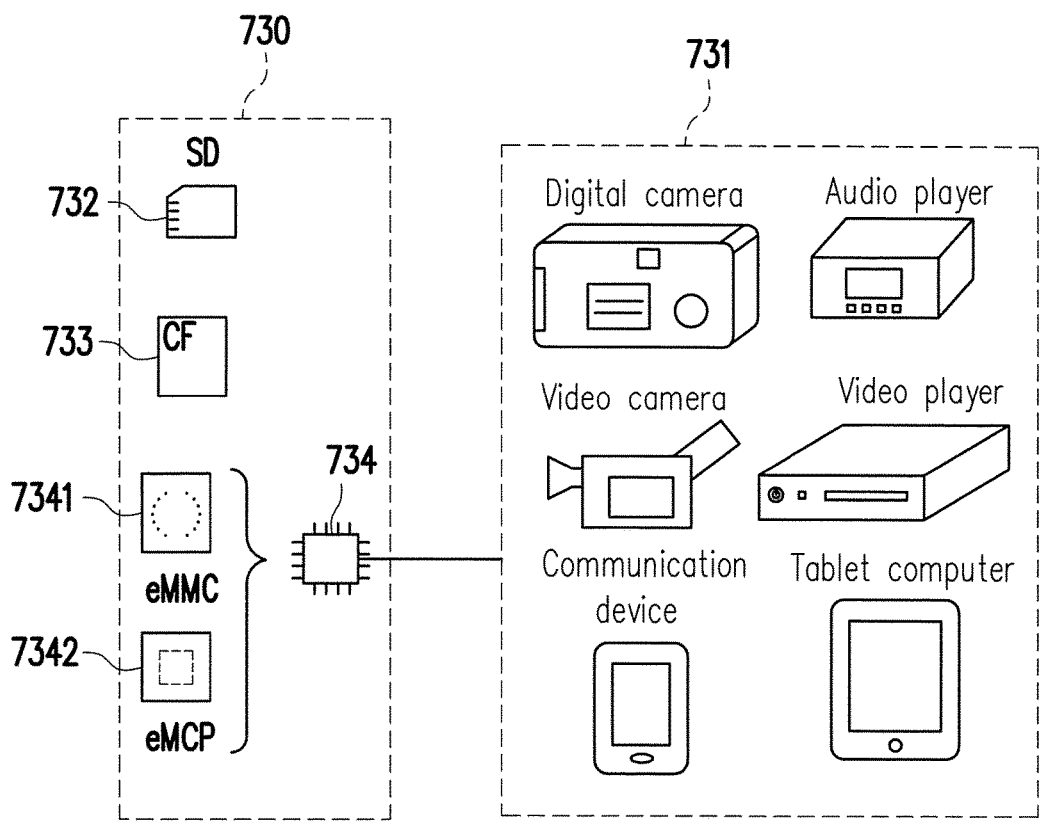
FIG. 7 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 7 is a schematic diagram illustrating a host system and a memory storage device according to another exemplary embodiment of the disclosure. Referring to FIG. 7, in another exemplary embodiment, a host system 731 may also be a system such as a digital camera, a video camera, a communication device, an audio player, a video player or a tablet computer, whereas a memory storage device 730 may be various non-volatile memory storage devices used by the host system 731, such as a SD (Secure Digital) card 732, a CF (Compact Flash) card 733 or an embedded storage device 734. The embedded storage device 734 includes various embedded storage devices capable of directly coupling a memory module onto a substrate of the host system, such as an eMMC (embedded Multi Media Card) 7341 and/or an eMCP (embedded Multi Chip Package) storage device 7342.

Figure 8:
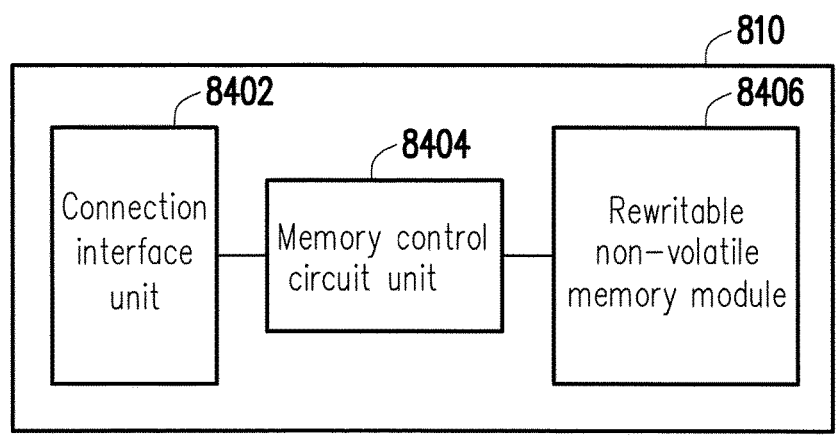
FIG. 8 is a schematic block diagram illustrating a memory storage device according to an exemplary embodiment of the disclosure.

FIG. 8 is a schematic block diagram illustrating a memory storage device according to an exemplary embodiment of the disclosure.

Referring to FIG. 8, the memory storage device 810 includes a connection interface unit 8402, a memory control circuit unit 8404 and a rewritable non-volatile memory module 8406.

The connection interface unit 8402 is configured to couple the memory storage device 810 to the host system 511. In the present exemplary embodiment, the connection interface unit 8402 is compatible with a SATA (Serial Advanced Technology Attachment) standard. Nevertheless, it should be understood that the disclosure is not limited thereto. The connection interface unit 8402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 8402 and the memory control circuit unit 8404 may be packaged into one chip, or the connection interface unit 8402 is distributed outside of a chip containing the memory control circuit unit 8404.

The memory control circuit unit 8404 is configured to execute a plurality of logic gates or control commands which are implemented in a hardware form or in a firmware form and perform operations, such as writing, reading or erasing data in the rewritable non-volatile memory module 8406 according to the commands of the host system 511.

The rewritable non-volatile memory module 8406 is coupled to the memory control circuit unit 8404 and configured to store data written from the host system 511. The rewritable non-volatile memory module 8406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 8406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". Each of the memory cells in the rewritable non-volatile memory module 8406 has a plurality of storage states depended on changes in the threshold voltage. The storage state to which the memory cell belongs may be determined by applying a read voltage to the memory cell, so as to obtain the one or more bits stored in the memory cell.

In the present exemplary embodiment, the memory cells of the rewritable non-volatile memory module 8406 constitute a plurality of physical programming units, and the physical programming units constitute a plurality of physical erasing units. Specifically, the memory cells on the same word line constitute one or more physical programming units. If each of the memory cells can store more than one bit, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. When the physical programming units are the physical pages, these physical programming units usually include a data bit area and a redundancy bit area. The data bit area includes multiple physical sectors configured to store user data, and the redundant bit area is configured to store system data (e.g., management data such as error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment, the switch module 10 of FIG. 1A (or the switch 11 of FIG. 1B) is disposed in the connection interface unit 8402. Accordingly, the switch module 10 can be used to transmit signal between the memory control circuit unit 8404 and connection interfaces with different types. For example, in an exemplary embodiment of FIG. 1A, the conductive unit 101 is coupled to the memory control circuit unit 8404; the conductive unit 102 is coupled to a first-type interface in the connection interface unit 8402 and configured to transmit signal between the memory control circuit unit 8404 and the first-type interface; and the conductive unit 103 is coupled to a second-type interface in the connection interface unit 8402 and configured to transmit signal between the memory control circuit unit 8404 and the second-type interface. Among them, the first-type interface is, for example, a connection interface compatible with USB type-c standard, and the second-type interface is, for example, a connection interface compatible with USB type-a standard. Moreover, in another exemplary embodiment, the first-type interface and the second-type interface may also be any two connection interfaces with different specifications instead of being limited to the above.

Figure 9:
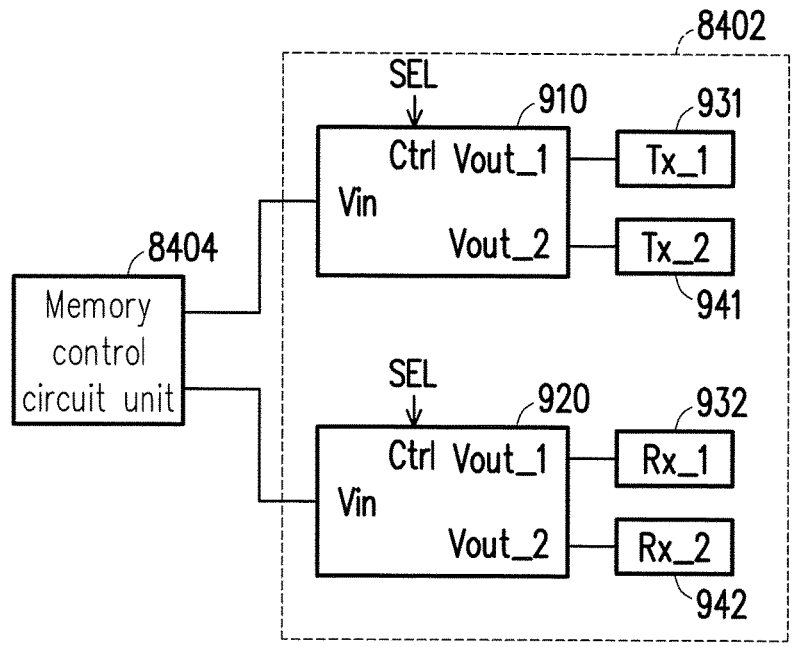
FIG. 9 is a schematic diagram illustrating a connection interface unit according to an exemplary embodiment of the disclosure.

FIG. 9 is a schematic diagram illustrating a connection interface unit according to an exemplary embodiment of the disclosure.

Referring to FIG. 9, in the present exemplary embodiment, the connection interface unit 8402 includes a switch 910, a switch 920, a signal transmitter (Tx_1) 931, a signal transmitter (Tx_2) 941, a signal receiver (Rx_1) 932 and a signal receiver (Rx_2) 942. A first terminal (Vin) of the switch 910 is coupled to the memory control circuit unit 8404. A second terminal (Vout_1) of the switch 910 is coupled to the signal transmitter 931. A third terminal (Vout_2) of the switch 910 is coupled to the signal transmitter 941. A first terminal (Vin) of the switch 920 is coupled to the memory control circuit unit 8404. A second terminal (Vout_1) of the switch 920 is coupled to the signal receiver 932. A third terminal (Vout_2) of the switch 920 is coupled to the signal receiver 942. In addition, each of the switch 910 and the switch 920 can receive the select signal SEL on the control terminal Ctrl, so as to turn on a conductive path (or a signal transmission path) between the terminal Vin and the terminal Vout_1 or between the terminal Vin and the terminal Vout_2 according to the select signal SEL. It should be noted that, each of the switch 910 and the switch 920 includes a circuit scheme identical or similar to that of the switch module 10 of FIG. 1A (or the switch 11 FIG. 1B), which is not repeated hereinafter.

In the present exemplary embodiment, the signal transmitter 931 and the signal receiver 932 are coupled to the first-type interface in the connection interface unit 8402, and the signal transmitter 941 and the signal receiver 942 are coupled to the second-type interface in the connection interface unit 8402. Among them, the first-type interface is, for example, a connection interface compatible with USB type-c standard, and the second-type interface is, for example, a connection interface compatible with USB type-a standard. However, the present disclosure is not limited thereto. The memory control circuit unit 8404 can transmit signal from the signal transmitter 931 to the first-type interface or from the signal transmitter 941 to the second-type interface through the switch 910. On the other hand, the memory control circuit unit 8404 can receive signal came from the first-type interface from the signal receiver 932 or signal came from the second-type interface from the signal receiver 942 through the switch 920.

Figure 10:
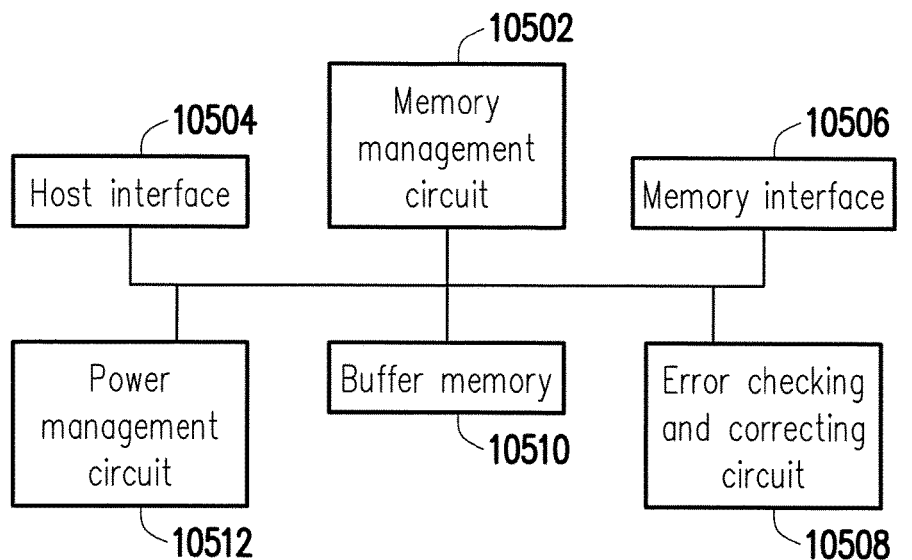
FIG. 10 is a schematic block diagram illustrating a memory control circuit unit according to an exemplary embodiment of the disclosure.

FIG. 10 is a schematic block diagram illustrating a memory control circuit unit according to an exemplary embodiment of the disclosure.

Referring to FIG. 10, the memory control circuit unit 8404 includes a memory management circuit 10502, a host interface 10504 and a memory interface 10506.

The memory management circuit 10502 is configured to control overall operation of the memory control circuit unit 8404. Specifically, the memory management circuit 10502 has a plurality of control commands and the control commands are executed to perform various operations such as witing, reading and erasing data during operation of the memory storage device 510. Hereinafter, operation of the memory management circuit 10502 is described as equivalent to describe operation of the memory control circuit unit 8404.

In the present exemplary embodiment, the control commands of the memory management circuit 10502 are implemented in form of firmware. For instance, the memory management circuit 10502 has a microprocessor unit (not illustrated) and a ROM (not illustrated), and the control commands are burned into the ROM. When the memory storage device 810 operates, the control commands are executed by the microprocessor to perform operations of writing, reading or erasing data.

In another exemplary embodiment, the control commands of the memory management circuit 10502 may also be stored as program codes in a specific area (for example, the system area in a memory exclusively used for storing system data) of the rewritable non-volatile memory module 8406. In addition, the memory management circuit 10502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 8406 to the RAM of the memory management circuit 10502 when the memory control circuit unit 8404 is enabled. Then, the control commands are executed by the microprocessor unit to perform operations, such as writing, reading or erasing data.

Further, in another exemplary embodiment, the control commands of the memory management circuit 10502 may also be implemented in a form of hardware. For example, the memory management circuit 10502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 8406 or a group thereof. The memory writing circuit is configured to issue a write command sequence for the rewritable non-volatile memory module 8406 in order to write data into the rewritable non-volatile memory module 8406. The memory reading circuit is configured to issue a read command sequence for the rewritable non-volatile memory module 8406 in order to read data from the rewritable non-volatile memory module 8406. The memory erasing circuit is configured to issue an erase command sequence for the rewritable non-volatile memory module 8406 in order to erase data from the rewritable non-volatile memory module 8406. The data processing circuit is configured to process both the data to be written into the rewritable non-volatile memory module 8406 and the data read from the rewritable non-volatile memory module 8406. Each of the write command sequence, the read command sequence and the erase command sequence may include one or more program codes or command codes, and instruct the rewritable non-volatile memory module 8406 to perform the corresponding operations, such as writing, reading and erasing. In an exemplary embodiment, the memory management circuit 10502 may further give command sequence of other types to the rewritable non-volatile memory module 8406 for instructing to perform the corresponding operations.

The host interface 10504 is coupled to the memory management circuit 10502 and configured to receive and identify commands and data sent from the host system 511. In other words, the commands and data transmitted by the host system 511 are transmitted to the memory management circuit 10502 via the host interface 10504. In the present exemplary embodiment, the host interface 10504 is compatible with the SATA standard. Nevertheless, it should be understood that the disclosure is not limited thereto. The host interface 10504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 10506 is coupled to the memory management circuit 10502 and configured to access the rewritable non-volatile memory module 8406. In other words, data to be written into the rewritable non-volatile memory module 8406 is converted into a format acceptable by the rewritable non-volatile memory module 8406 via the memory interface 10506. Specifically, if the memory management circuit 10502 intends to access the rewritable non-volatile memory module 8406, the memory interface 10506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection procedure). These command sequences are generated by the memory management circuit 10502 and transmitted to the rewritable non-volatile memory module 8406 through the memory interface 10506, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 8404 further includes an error checking and correcting circuit 10508, a buffer memory 10510 and a power management circuit 10512.

The error checking and correcting circuit 10508 is coupled to the memory management circuit 10502 and configured to perform an error checking and correcting operation to ensure the correctness of data. Specifically, when the memory management circuit 10502 receives the write command from the host system 511, the error checking and correcting circuit 10508 generates an ECC (error correcting code) and/or an EDC (error detecting code) for data corresponding to the write command, and the memory management circuit 10502 writes data corresponding to the write command and the corresponding ECC and/or the EDC into the rewritable non-volatile memory module 8406. Then, when the memory management circuit 10502 reads the data from the rewritable non-volatile memory module 8406, the corresponding ECC and/or the EDC are also read, and the error checking and correcting circuit 10508 performs the error checking and correcting operation on the read data based on the ECC and/or the EDC.

The buffer memory 10510 is coupled to the memory management circuit 10502 and configured to temporarily store data and commands from the host system 511 or data from the rewritable non-volatile memory module 8406. The power management unit 10512 is coupled to the memory management circuit 10502 and configured to control a power of the memory storage device 510.

In an exemplary embodiment, the switch module 10 of FIG. 1A is disposed in the host interface 10504. Accordingly, the switch module 10 can be used to transmit signals between the memory management circuit 10502 and the connection interfaces with different types. For example, in an exemplary embodiment of FIG. 1A, the conductive unit 101 is coupled to the memory management circuit 10502; the conductive unit 102 is coupled to a first-type interface in the connection interface unit 8402 and configured to transmit signal between the memory management circuit 10502 and the first-type interface; and the conductive unit 103 is coupled to a second-type interface in the connection interface unit 8402 and configured to transmit signal between the memory management circuit 10502 and the second-type interface. Among them, the first-type interface is, for example, a connection interface compatible with USB type-c standard, and the second-type interface is, for example, a connection interface compatible with USB type-a standard. However, the disclosure is not limited thereto.

Figure 11:
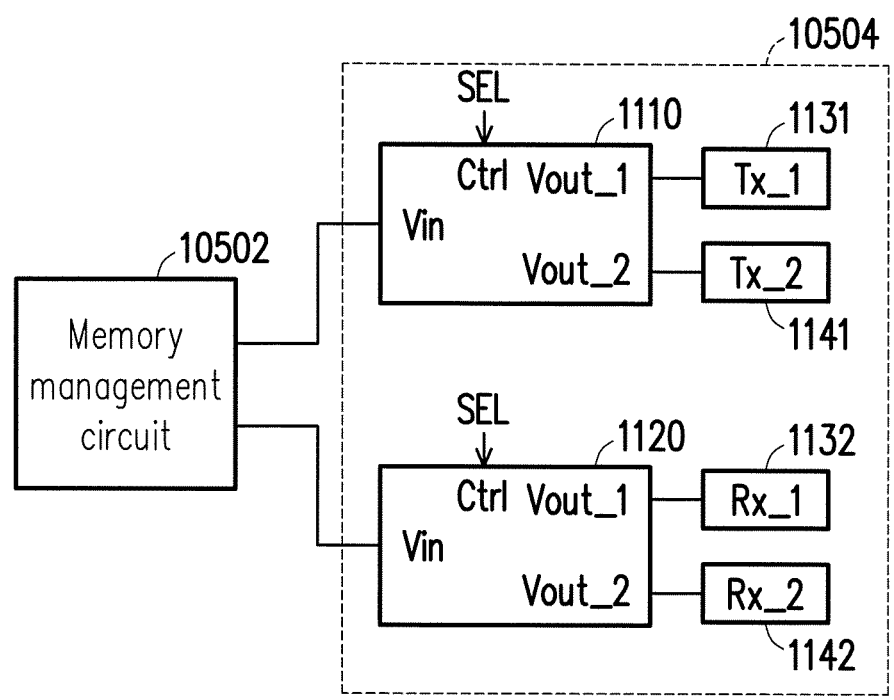
FIG. 11 is a schematic diagram illustrating a host interface according to an exemplary embodiment of the disclosure.

FIG. 11 is a schematic diagram illustrating a host interface according to an exemplary embodiment of the disclosure.

Referring to FIG. 11, in the present exemplary embodiment, the host interface 10504 includes a switch 1110, a switch 1120, a signal transmitter (Tx_1) 1131, a signal transmitter (Tx_2) 1141, a signal receiver (Rx_1) 1132 and a signal receiver (Rx_2) 1142. The memory management circuit 10502 can transmit signal from the signal transmitter 1131 to the first-type interface or from the signal transmitter 1141 to the second-type interface through the switch 1110. On the other hand, the memory management circuit 10502 can receive signal came from the first-type interface from the signal receiver 1132 or signal came from the second-type interface from the signal receiver 1142 through the switch 1120. It should be noted that, in the present exemplary embodiment, the switch 1110, the switch 1120, the signal transmitter 1131, the signal transmitter 1141, the signal receiver 1132 and the signal receiver 1142 are respectively identical or similar to the switch 910, the switch 920, the signal transmitter 931, the signal transmitter 941, the signal receiver 932 and the signal receiver 942 in the exemplary embodiment of FIG. 9, which are not repeated hereinafter.

In summary, the switch module proposed by the disclosure includes the conductive unit, the switch unit and the electrostatic protection module. The electrostatic protection module is coupled between the conductive unit and the first switch unit and includes the protection circuit and the inductor circuit. In particular, the inductor circuit includes at least one inductor unit and is coupled between the protection circuit and the conductive unit. In this way, when high speed signal is passing by, the inductor circuit may be used to mask (or block) the protection circuit that may cause adverse influence on high speed signal, so as to improve the transmission efficiency for high speed signal. Moreover, in an exemplary embodiment, the switch module can be disposed alone or in pairs in the memory storage device and configured to transmit signal through different types of connection interfaces.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A switch module, comprising:
a first conductive unit;
a first switch unit;
a first electrostatic protection module, coupled between the first conductive unit and the first switch unit;
a second conductive unit; and
a second electrostatic protection module, coupled between the second conductive unit and the first switch unit,
wherein the first electrostatic protection module comprises a first protection circuit and a first inductor circuit,
wherein the first inductor circuit comprises a first inductor unit, and the first inductor circuit is coupled between the first protection circuit and the first conductive unit,
wherein the second electrostatic protection module comprises a second protection circuit and a second inductor circuit,
wherein the second inductor circuit comprises a third inductor unit, and the second inductor circuit is coupled between the second protection circuit and the second conductive unit.

2. The switch module according to claim 1, wherein the first inductor circuit further comprises a second inductor unit,
wherein a first terminal of the first inductor unit is coupled to the first conductive unit,
wherein a first terminal of the second inductor unit is coupled to a second terminal of the first inductor unit,
wherein a second terminal of the second inductor unit is coupled to the first switch unit,
wherein the first protection circuit is coupled between the second terminal of the first inductor unit and the first terminal of the second inductor unit.

3. The switch module according to claim 1, wherein the first electrostatic protection module is coupled to a first conductive path between the first conductive unit and the first switch unit,
wherein the second electrostatic protection module is coupled to a second conductive path between the second conductive unit and the first switch unit,
wherein the first switch unit is configured to turn on the first conductive path and the second conductive path, so as to transmit signal between the first conductive unit and the second conductive unit.

4. The switch module according to claim 3, further comprising:
a third conductive unit;
a second switch unit; and
a third electrostatic protection module, coupled to a third conductive path between the third conductive unit and the second switch unit,
wherein the third electrostatic protection module comprises a third protection circuit and a third inductor circuit,
wherein the third inductor circuit comprises a fourth inductor unit, and the third inductor circuit is coupled between the third protection circuit and the third conductive unit,
wherein the second switch unit is configured to turn on the first conductive path and the third conductive path, so as to transmit signal between the first conductive unit and the third conductive unit.

5. The switch module according to claim 4, wherein the second switch unit does not turn on the first conductive path and the third conductive path if the first conductive path and the second conductive path are turned on by the first switch unit,
wherein the first switch unit does not turn on the first conductive path and the second conductive path if the first conductive path and the third conductive path are turned on by the second switch unit.

6. A memory storage device, comprising:
a connection interface unit configured to couple to a host system;
a rewritable non-volatile memory module; and
a memory control circuit unit, coupled to the connection interface unit and the rewritable non-volatile memory module,
wherein the connection interface unit comprises a first switch module,
wherein the first switch module comprises:
a first conductive unit;
a first switch unit;
a first electrostatic protection module, coupled between the first conductive unit and the first switch unit;
a second conductive unit; and
a second electrostatic protection module, coupled between the second conductive unit and the first switch unit,
wherein the first electrostatic protection module comprises a first protection circuit and a first inductor circuit,
wherein the first inductor circuit comprises a first inductor unit, and the first inductor circuit is coupled between the first protection circuit and the first conductive unit,
wherein the second electrostatic protection module comprises a second protection circuit and a second inductor circuit, wherein the second inductor circuit comprises a third inductor unit, and the second inductor circuit is coupled between the second protection circuit and the second conductive unit.

7. The memory storage device according to claim 6, wherein the first inductor circuit further comprises a second inductor unit,
 wherein a first terminal of the first inductor unit is coupled to the first conductive unit,
 wherein a first terminal of the second inductor unit is coupled to a second terminal of the first inductor unit,
 wherein a second terminal of the second inductor unit is coupled to the first switch unit,
 wherein the first protection circuit is coupled between the second terminal of the first inductor unit and the first terminal of the second inductor unit.

8. The memory storage device according to claim 6, wherein the first electrostatic protection module is coupled to a first conductive path between the first conductive unit and the first switch unit,
 wherein the second electrostatic protection module is coupled to a second conductive path between the second conductive unit and the first switch unit,
 wherein the first switch unit is configured to turn on the first conductive path and the second conductive path, so as to transmit signal between the first conductive unit and the second conductive unit.

9. The memory storage device according to claim 8, wherein the first switch module further comprises:
 a third conductive unit;
 a second switch unit; and
 a third electrostatic protection module, coupled to a third conductive path between the third conductive unit and the second switch unit,
 wherein the third electrostatic protection module comprises a third protection circuit and a third inductor circuit,
 wherein the third inductor circuit comprises a fourth inductor unit, and the third inductor circuit is coupled between the third protection circuit and the third conductive unit,
 wherein the second switch unit is configured to turn on the first conductive path and the third conductive path, so as to transmit signal between the first conductive unit and the third conductive unit.

10. The memory storage device according to claim 9, wherein the second switch unit does not turn on the first conductive path and the third conductive path if the first conductive path and the second conductive path are turned on by the first switch unit,
 wherein the first switch unit does not turn on the first conductive path and the second conductive path if the first conductive path and the third conductive path are turned on by the second switch unit.

11. The memory storage device according to claim 6, wherein a first terminal of the first switch module is coupled to the memory control circuit unit,
 wherein a second terminal of the first switch module is coupled to a first-type interface of the connection interface unit,
 wherein a third terminal of the first switch module is coupled to a second-type interface of the connection interface unit,
 wherein the first conductive unit is disposed at one of the first terminal, the second terminal and the third terminal of the first switch module.

12. The memory storage device according to claim 11, wherein the connection interface unit further comprises a second switch module,
 wherein a first terminal of the second switch module is coupled to the memory control circuit unit,
 wherein a second terminal of the second switch module is coupled to the first-type interface of the connection interface unit,
 wherein a third terminal of the second switch module is coupled to the second-type interface of the connection interface unit.

13. The memory storage device according to claim 12, wherein the second switch module comprises:
 a fourth conductive unit;
 a third switch unit; and
 a fourth electrostatic protection module, coupled between the fourth conductive unit and the third switch unit,
 wherein the fourth electrostatic protection module comprises a fourth protection circuit and a fourth inductor circuit,
 wherein the fourth inductor circuit comprises a fifth inductor unit, and the fourth inductor circuit is coupled between the fourth protection circuit and the fourth conductive unit.

14. The memory storage device according to claim 13, wherein the fourth conductive unit is disposed at one of the first terminal, the second terminal and the third terminal of the second switch module.

15. A multiplexer, comprising:
 a first terminal;
 a second terminal;
 a third terminal;
 a control terminal; and
 a switch module, coupled to the first terminal, the second terminal, the third terminal and the control terminal, and the switch module is configured to turn on a conductive path between the first terminal and the second terminal or between the first terminal and the third terminal according to a select signal of the control terminal,
 wherein the switch module comprises:
 a first conductive unit;
 a first switch unit;
 a first electrostatic protection module, coupled between the first conductive unit and the first switch unit;
 a second conductive unit; and
 a second electrostatic protection module, coupled between the second conductive unit and the first switch unit,
 wherein the first electrostatic protection module comprises a first protection circuit and a first inductor circuit,
 wherein the first inductor circuit comprises a first inductor unit, and the first inductor circuit is coupled between the first protection circuit and the first conductive unit,
 wherein the second electrostatic protection module comprises a second protection circuit and a second inductor circuit,
 wherein the second inductor circuit comprises a third inductor unit, and the second inductor circuit is coupled between the second protection circuit and the second conductive unit.

16. The multiplexer according to claim 15, wherein the first inductor circuit further comprises a second inductor unit, wherein a first terminal of the first inductor unit is coupled to the first conductive unit,
wherein a first terminal of the second inductor unit is coupled to a second terminal of the first inductor unit,
wherein a second terminal of the second inductor unit is coupled to the first switch unit,
wherein the first protection circuit is coupled between the second terminal of the first inductor unit and the first terminal of the second inductor unit.

17. The multiplexer according to claim 15, wherein the first electrostatic protection module is coupled to a first conductive path between the first conductive unit and the first switch unit,
wherein the second electrostatic protection module is coupled to a second conductive path between the second conductive unit and the first switch unit,
wherein the first switch unit is configured to turn on the first conductive path and the second conductive path, so as to transmit signal between the first conductive unit and the second conductive unit.

18. The multiplexer according to claim 17, wherein the switch module further comprises:
a third conductive unit;
a second switch unit; and
a third electrostatic protection module, coupled to a third conductive path between the third conductive unit and the second switch unit,
wherein the third electrostatic protection module comprises a third protection circuit and a third inductor circuit,
wherein the third inductor circuit comprises a fourth inductor unit, and the third inductor circuit is coupled between the third protection circuit and the third conductive unit,
wherein the second switch unit is configured to turn on the first conductive path and the third conductive path, so as to transmit signal between the first conductive unit and the third conductive unit.

19. The multiplexer according to claim 18, wherein the second switch unit does not turn on the first conductive path and the third conductive path if the first conductive path and the second conductive path are turned on by the first switch unit,
wherein the first switch unit does not turn on the first conductive path and the second conductive path if the first conductive path and the third conductive path are turned on by the second switch unit.

20. The multiplexer according to claim 15, wherein the first conductive unit is coupled to the first terminal, the second terminal or the third terminal of the multiplexer.

* * * * *